United States Patent [19]

Mies

[11] Patent Number: 5,483,215
[45] Date of Patent: Jan. 9, 1996

[54] CURRENT TRANSFORMER FOR LINES

[75] Inventor: Johannes Mies, Korperich, Germany

[73] Assignee: Dipl.-Ing. H. Horstmann GmbH, Heiligenhaus, Germany

[21] Appl. No.: 306,498

[22] Filed: Sep. 13, 1994

[30] Foreign Application Priority Data

Sep. 15, 1993 [DE] Germany ............... 43 31 265.9

[51] Int. Cl.⁶ ................ H01F 27/26; H01F 27/30
[52] U.S. Cl. ................................. 336/176; 324/127
[58] Field of Search ....................... 324/127, 133; 336/175, 176

[56] References Cited

U.S. PATENT DOCUMENTS

| | | | |
|---|---|---|---|
| 4,456,873 | 6/1984 | Schweitzer, Jr. | 336/176 |
| 4,646,006 | 2/1987 | Schweitzer, Jr. | 336/176 |
| 5,180,972 | 1/1993 | Schweitzer, Jr. | 336/176 |

*Primary Examiner*—Thomas J. Kozma
*Attorney, Agent, or Firm*—Edwin D. Schindler

[57] ABSTRACT

A current transformer, which is able to be mounted with a switching bar on a conductor having a high voltage, has a coil surrounding a U-shaped iron yoke. A U-shaped ground iron is swivel-mounted on one leg of the iron yoke and is supported at a break point. Springs are anchored on a housing for the transformer. When the current transformer is mounted, the conductor moves the ground iron in a closing position and is maintained in such position by the springs.

8 Claims, 3 Drawing Sheets

CURRENT TRANSFORMER FOR LINES

BACKGROUND OF THE INVENTION

The invention relates to a current transformer for power lines, of which the housing has an induction coil, which detects the magnetic field of a current-conducting conductor. In this system, said conductor represents the primary coil with only one winding.

SUMMARY OF THE INVENTION

The problem of the invention is to create a particularly simple current transformer, which is mountable with a switching bar on a conductor live with high voltage.

According to the invention, said problem is solved in that the coil surrounds a U-shaped iron yoke; that a U-shaped ground iron is swivel-mounted on the one leg of the yoke; that the U-shaped ground iron is supported at the one break point; that springs are anchored on the housing; and that the conductor, when the current transformer is mounted, moves the ground iron in the closing position and is maintained in said position by the springs.

BRIEF DESCRIPTION OF THE DRAWINGS FIGURES

An exemplified embodiment is explained in greater detail by reference to FIGS. 1 to 9 of the drawing, in which.

DETAILED DESCRIPTION OF THE DRAWING AND PREFERRED EMBODIMENTS

Figure 1:
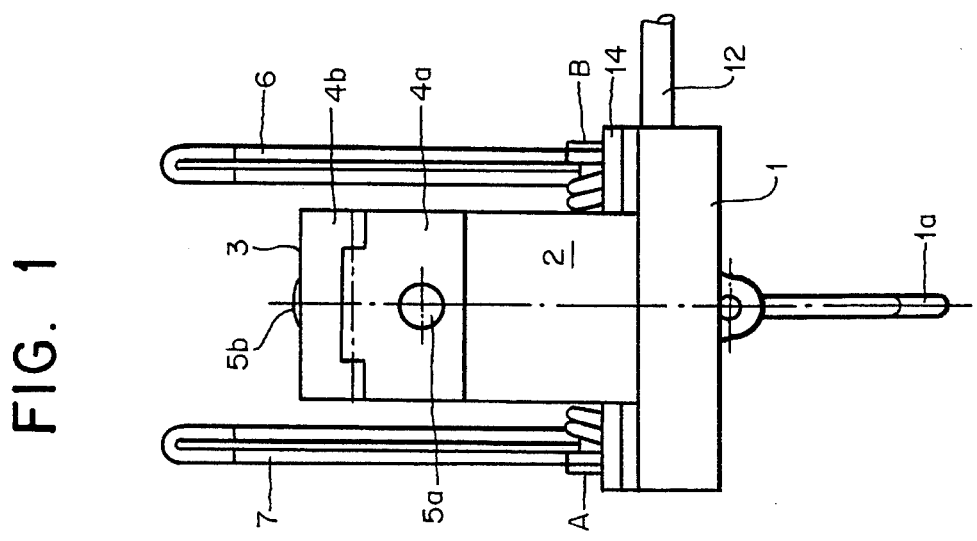
FIG. 1 shows the current transformer from the side.

In FIG. 1, 1 denotes an insulating material housing, on which a grip eye 1a is swivel-mounted. A U-shaped iron yoke 2 is inserted in the housing, on which a U-shaped ground iron 3 is swivel-mounted. A hinge 4a, 4b, which is fastened on the yoke 2 and the ground iron 3 with the rivets 5a, 5b, serves as the support.

The leg springs 6 and 7 are visible to the left and right of the yoke 2 and the ground iron 3, said springs being supported on a rotary axle AB.

Figure 2:
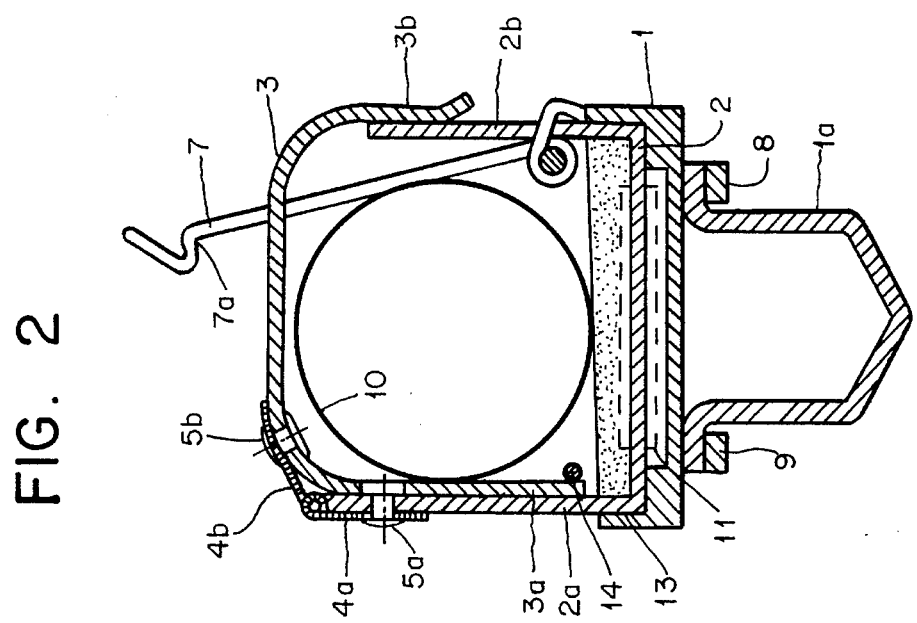
FIG. 2 is a sectional front view.

FIG. 2 shows a sectional front view of the transformer. The yoke 2 with a coil 11 wound around said yoke is inserted in the trough-shaped housing 1. The yoke and the coil are fastened and protected by a Dourable sealing compound 13. The ground iron 3 is shown in the closing position. The spring 7 pushes a large circular conductor 10 against the left leg 3a of the ground iron 3. This causes the right leg 3b of the ground iron to be forced against the right leg 2b of the yoke. The consequence is a good magnetic power flow between the parts of the iron circuit and an intimate coupling between the primary conductor 10 and the secondary transformer coil 11.

In this way, each primary change in the magnetic field induces in the measuring coil 11 a defined voltage, which can be derived and indicated.

Numeral 12 denotes the measuring cable, which is extended outwardly. The eye 1a, which is formed by bent wire, is fastened on the bottom of the housing 1 with the help of the molded bearing shields 8, 9. Now, when the transformer is pulled down with the help of the eye 1a, the conductor 10 forces the ground iron 3 into the opening position according to FIG. 7 until a cross pin 14, the latter being connected with the leg 3a, strikes against the locking nose 7a of the spring 7.

Figure 3:
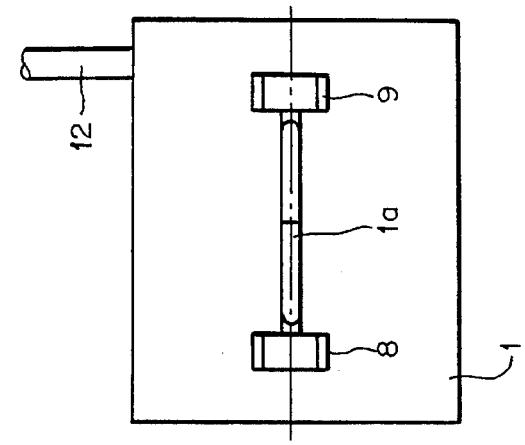
FIG. 3 is a view from the bottom.

FIG. 3 shows the plastic housing 1 from the bottom. The bearing shields 8, 9, which support the eye 1a, project from the surface. The measuring cable 12 is extended to the outside laterally and sealed together with the coil with pourable sealing compound in such a way that the parts are protected against weather influences.

Figure 4:
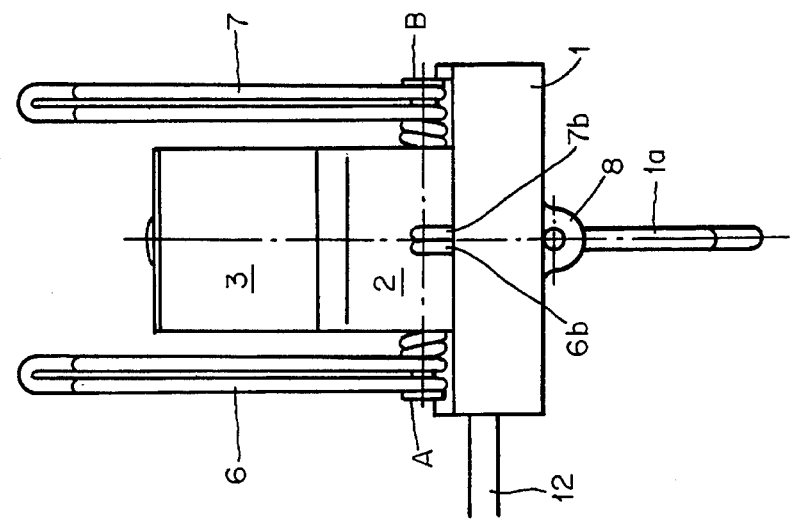
FIG. 4 is a view from the other side.

FIG. 4 shows the current transformer from the other side. Since the leg springs have to be effective within an angle range of about 90 degrees, they require a great number of screw windings, which are covered by the iron yoke 2. The bent ends 6b, 7b of the springs 6, 7 are plugged through bores in the yoke 2.

Figure 5:
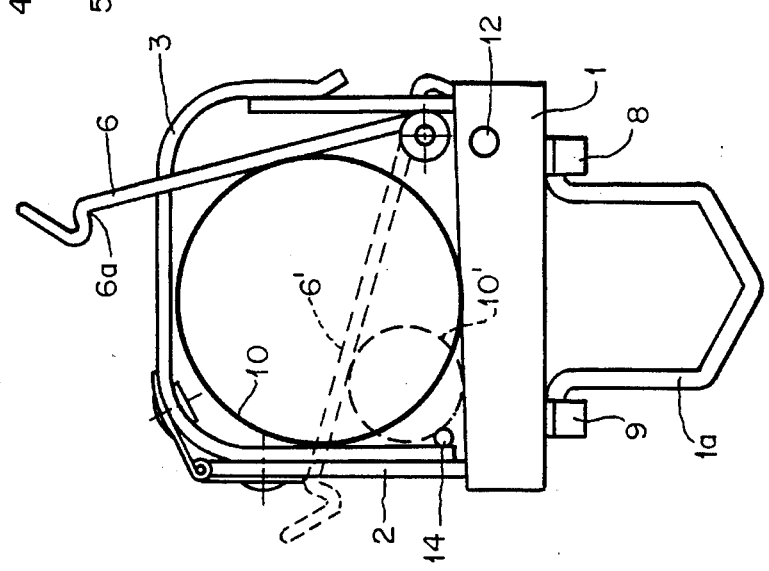
FIG. 5 is a front view in the functional condition.

The front view of the transformer according to FIG. 5 shows that the conductor 10 almost completely fills the space between the housing, the yoke and the ground.

Another exemplified embodiment with a much smaller conductor 10' is indicated by broken lines. The spring, which is deflected far to the left, is denoted by 6'. Even with a very small conductor it still performs its function of pressing the conductor against the ground iron and the yoke, so that the iron circuit is closed.

The pressing of small conductors against the left leg 3a of the ground iron 3 is enhanced further in that the top side of the housing 1 is slightly slanted to the left. The parts of the transformer are designed in such a way that they can be pushed also onto rectangular power rails or multi-core cables of any shape.

Since the measuring coil 11 can be efficiently insulated against the iron circuit and the conductor, no insulation of the conductor 10 is required if the signal and/or indication is/are processed directly on the transformer. An LED-display can be used as the optic indicator element on the transformer.

If it is desired to install the display site in connection with uninsulated high-voltage conductors away from the latter, the distance to the site of the transformer can be bridged with the help of a fiber-optical conductor.

Figure 6:
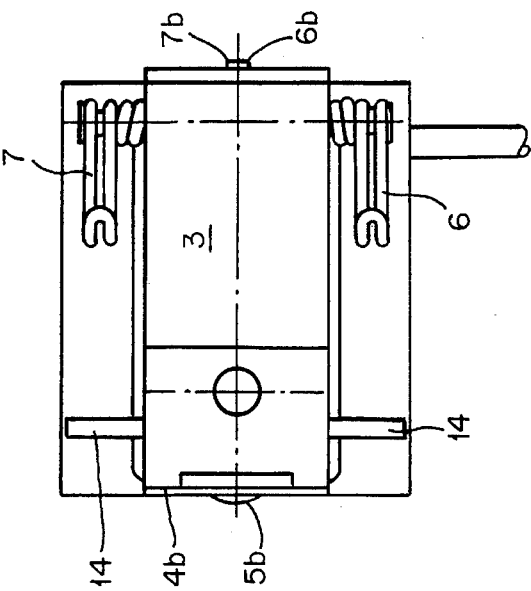
FIG. 6 is a view from the top.

FIG. 6 shows a top view of the closed transformer. The springs 6 and 7 are in the same position as in FIG. 5, i.e., with the inserted conductor. Without the latter, they would rest flat on the housing 1. The pin 14 projects laterally far beyond the ground iron 3, so that it is capable of contacting the springs 6 and 7 when the transformer is opened.

A two-component casting resin can be used as the pourable sealing compound for the coil 11, which resin rigidly joins the housing with the iron circuit and, at the same time, protects the coil against weather influences. The ends of the coil are connected to the measuring cable 12, the end of the latter being embedded tight against moisture.

The current transformer described above is mounted with a switching bar, of which the adjustment hook locks in the grip eye 1a. The ground iron 3 is folded up and thus turned by approximately 100° degrees when the transformer is to be pushed over a conductor.

Figure 9:
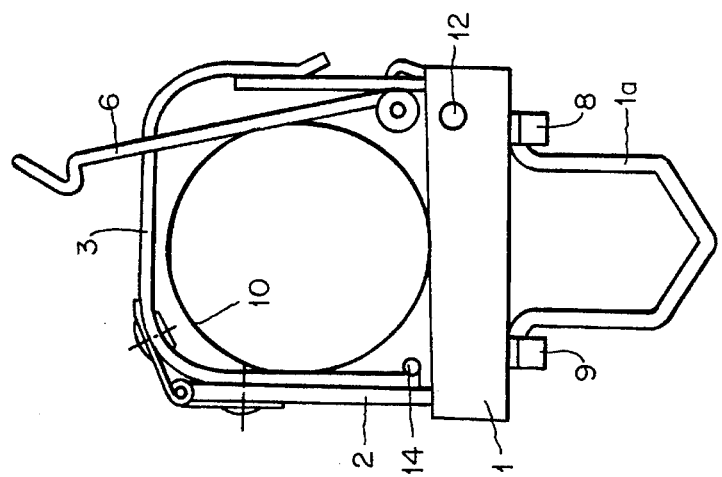
FIG. 9 shows a closed transformer enclosing the conductor.
Figure 8:
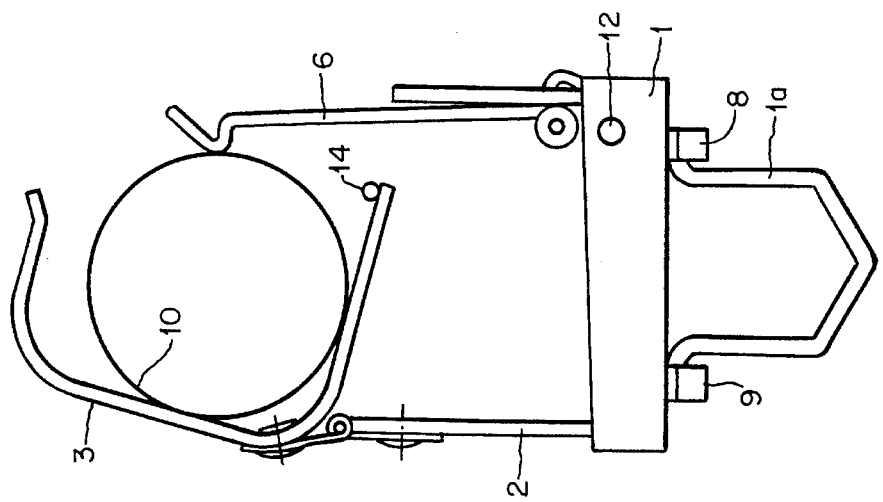
FIG. 8 shows a transformer in the semi-closed position.
Figure 7:
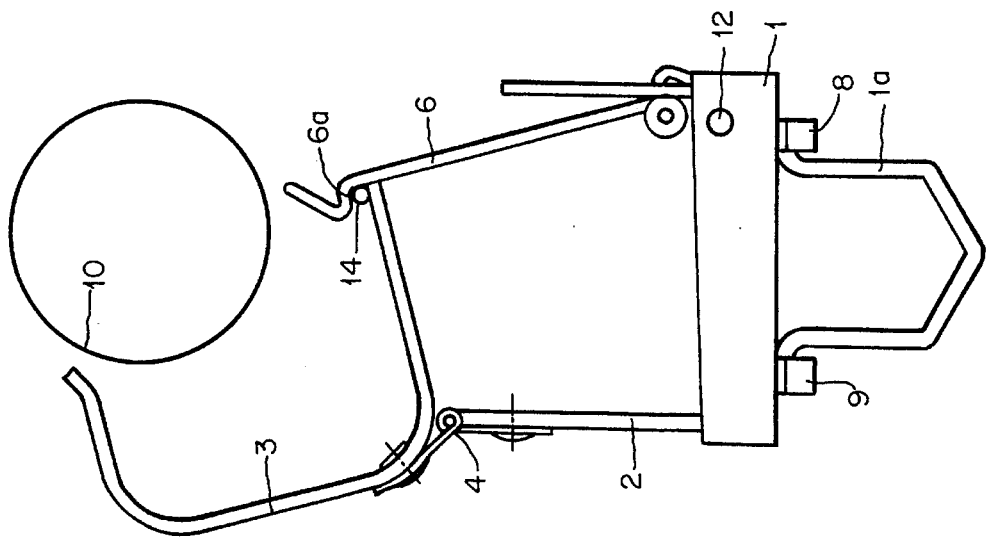
FIG. 7 shows an open transformer prior to the penetration of the conductor.

FIGS. 7, 8 and 9 show in three instantaneous illustrations the beginning of the mounting or push-on, the point of maximum deflection of the springs, and the final condition of the conductor 10 surrounded by the transformer.

When the conductor 10 penetrates the ground iron 3, it tilts said iron to the right as the springs 6, 7 are being deformed, until the iron circuit completely closes according to FIG. 9. In said final condition, the springs 6, 7 press the conductor 10 against the leg 3a, and the transformer is operable.

A voltage that is proportional to the primary current in the conductor 10 is received at the integrated coil of the transformer. The measured value is transmitted to an evaluation station via the measuring cable 12.

The invention is not limited to the exemplified embodiment shown. Adaptation of the transformer to different conductor diameters can be realized also in that provision is made at two opposite sides of the housing for a plurality of alternatively usable recesses for anchoring the springs. The transformer can then be easily adapted to different conductor diameters by replugging the springs, preferably leaf springs.

In order to secure the springs against falling out, lids can be mounted laterally for covering the recesses, so that the latter are open only in the direction in which the springs exit. Undercuts, in particular dovetail profiles can be used for mounting the lids.

The great advantage of the novel-type of current transformer lies in that it can be mounted with a minimum of construction parts from a safe distance with the help of a switching bar, and that it can be adapted to different conductor diameters with one design.

In connection with the current transformer described above, the measured signal, a voltage, is transmitted to a measuring station with the help of a measuring cable 12.

Alternatively, the signal can be processed directly on the measuring transformer. For this purpose, the housing of the transformer is enlarged to such a extent that a short-circuit indicator provided, for example with a flashing light, can be accommodated in said housing.

In this case, the housing will approximately have the shape of a cube supporting the grip eye and a flashing diode on its bottom side. In addition, a screw cover can be integrated in the bottom side, so that a battery change is readily possible.

I claim:

1. A current transformer for rails, cables and open-wire lines, comprising:

a housing;

an induction coil contained within said housing;

a U-shaped iron yoke enclosed within said induction coil, each portion of said U-shaped iron yoke being a leg;

a U-shaped ground iron being swivel-mounted on one leg of said U-shaped iron yoke, said U-shaped ground iron being supported at a brake point;

spring means being anchored within said housing; and, a conductor capable of moving said U-shaped ground iron., when the current transformer is mounted, into a closing position and is maintained in said closed position by said spring means.

2. Current transformer according to claim 1, wherein the spring means are designed as leg springs with a large spring angle, which retain the open ground iron in a locked position and, in the closing condition, press said conductor having any desired diameter against the closed ground iron.

3. Current transformer according to claim 1, wherein the housing made of plastic has on the bottom side an eye for attaching a switching bar.

4. Current transformer according to claim 3, characterized in that the housing has on the top side a trough in which the coil with the yoke leg penetrating said coil is sealed by pourable sealing compound.

5. Current transformer according to claim 1, wherein the ground iron is connected with one of the yoke legs by a hinge, and that a rotary axle (AB) of the spring means in the form of leg springs are disposed diagonally oppositely near another of the yoke legs.

6. Current transformer according to claim 1, wherein the top side of the housing is slightly slanted in the direction of the one leg in order to optimally press on smaller conductors.

7. Current transformer according to claim 1, wherein the housing has on opposite sides a plurality of alternatively usable recesses for the spring means so that the transformer is adaptable to different conductor diameters by replugging the spring means.

8. Current transformer according to claim 7, characterized in that the spring means are secured in their recesses by lids connected with the housing via dovetail profiles.

* * * * *